(12) United States Patent
Sugahara et al.

(10) Patent No.: US 8,158,269 B2
(45) Date of Patent: *Apr. 17, 2012

(54) COMPOSITE MATERIAL FOR ELECTRICAL/ELECTRONIC PART AND ELECTRICAL/ELECTRONIC PART USING THE SAME

(75) Inventors: Chikahito Sugahara, Tokyo (JP); Satoru Zama, Tokyo (JP); Akira Tachibana, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/977,147

(22) Filed: Dec. 23, 2010

(65) Prior Publication Data

US 2011/0091739 A1 Apr. 21, 2011

Related U.S. Application Data

(63) Continuation of application No. PCT/JP2009/061430, filed on Jun. 23, 2009.

(30) Foreign Application Priority Data

Jun. 24, 2008 (JP) ................... 2008-164851
Nov. 25, 2008 (JP) ................... 2008-300181

(51) Int. Cl.
*B32B 15/00* (2006.01)

(52) U.S. Cl. ........ 428/458; 428/209; 428/624; 428/626; 174/258; 174/259

(58) Field of Classification Search .................. 428/209, 428/458, 624, 626; 174/258, 259
See application file for complete search history.

(56) References Cited

U.S. PATENT DOCUMENTS
2005/0281994 A1  12/2005  Tani et al.

FOREIGN PATENT DOCUMENTS
| JP | 5-245432 A | 9/1993 |
| JP | 2802402 B2 | 9/1998 |
| JP | 2002-237542 A | 8/2002 |
| JP | 2004-197224 A | 7/2004 |
| JP | 2006-086513 A | 3/2006 |

OTHER PUBLICATIONS

International Search Report, dated Aug. 11, 2009 issued in PCT/JP2009/061430.

*Primary Examiner* — Cathy Lam
(74) *Attorney, Agent, or Firm* — Birch, Stewart, Kolasch & Birch, LLP

(57) ABSTRACT

A composite material for an electrical/electronic part, which is used as a material for use in an electrical/electronic part formed by punching process, containing a metal base material of, for example, a copper-type metal material and a substantially one layer of an insulating film provided on at least a part of the metal base material, in which a metal layer formed of Ni or a Ni—Zn alloy is interposed between said metal base material and said insulating film, such that the peel width of said insulating film at the end of the material obtained after said punching process, is less than 10 μm.

6 Claims, 1 Drawing Sheet

[Fig. 1]
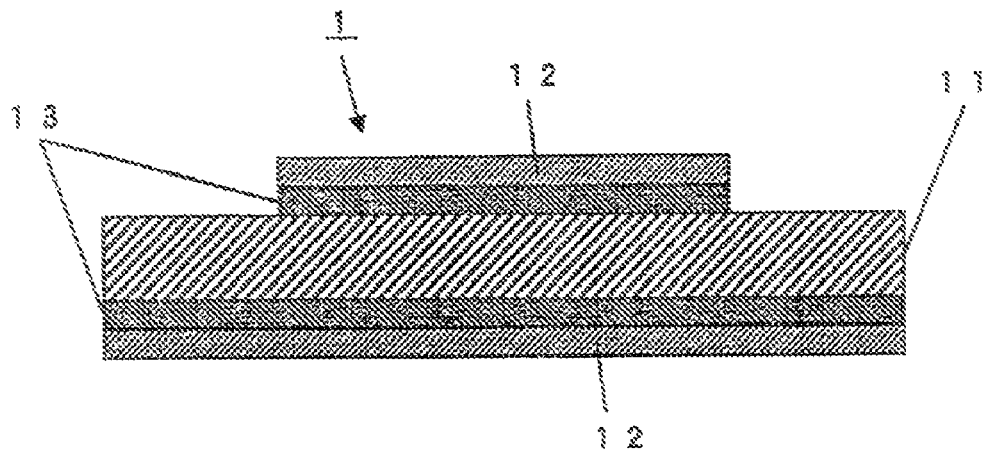
[Fig. 2]
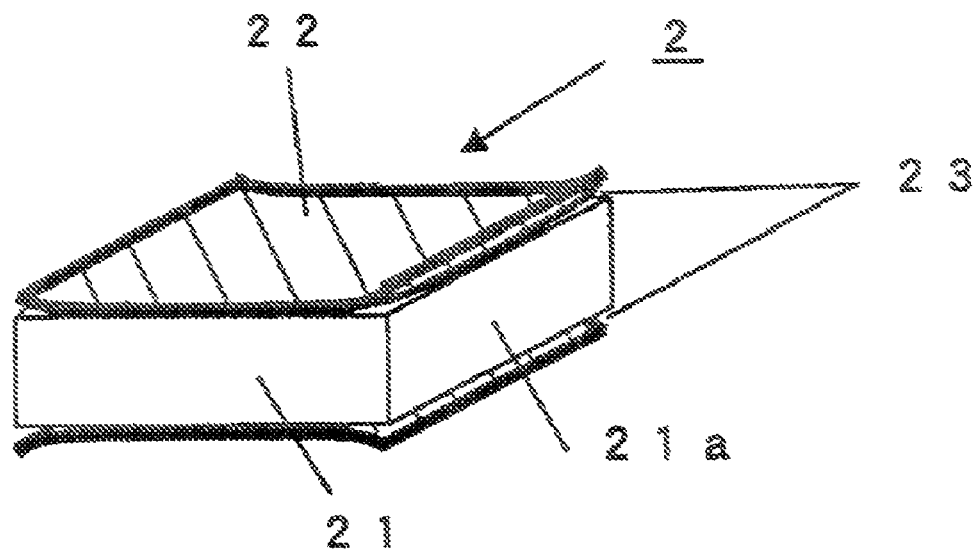
PRIOR ART

COMPOSITE MATERIAL FOR ELECTRICAL/ELECTRONIC PART AND ELECTRICAL/ELECTRONIC PART USING THE SAME

CROSS REFERENCE TO RELATED APPLICATIONS

This application is a Continuation of copending PCT International Application No. PCT/JP2009/061430 filed on Jun. 23, 2009, which claims priority of Application No. 2008-164851 filed in Japan on Jun. 24, 2008 and Application No. 2008-300181 filed in Japan on Nov. 25, 2008, all of which are hereby expressly incorporated by reference into the present application.

TECHNICAL FIELD

The present invention relates to a composite material for an electrical/electronic part having an insulating film on a metal base material, and an electrical/electronic part using the same.

BACKGROUND ART

A metal material provided with an electric insulating film on a metal base material (also referred to simply as an insulating film in the present invention) is utilized in, for example, a circuit board as a shielding material (see, for example, Patent Literature 1). The metal material is suitable for a container, a case, a cover, a cap and the like, especially for a low height device container case (a height of an internal space is lowered).

In order to improve an adhesion between the metal base material and the insulating film of the metal material with the insulating film, there have been methods, in which a coupling agent is applied on a surface of a metal base material (see, for example, Patent Literature 2), or a plating layer having a dendrite crystal is formed on a surface of a metal base material (see, for example, Patent Literature 3).

Patent Literature 1: JP-A-2004-197224 ("JP-A" means unexamined published Japanese patent application)
Patent Literature 2: Japanese Patent No. 2802402
Patent Literature 3: JP-A-5-245432

DISCLOSURE OF INVENTION

Technical Problem

When the metal material provided with the insulating film on the metal base material is applied as a material for the electrical/electronic part, since the insulating film is provided on the metal base material, it is possible to arrange connector contacts with a narrow pitch through machining such as punching at a spot including an interface between the metal base material and the insulating film to form the connector contacts. Accordingly, the material may be applicable to various applications.

When the machining such as the punching is carried out on the spot including the interface between the metal base material and the insulating film of the conventionally used material, a slight gap of around several μm to several tens μm may be created between the metal base material and the insulating film at the machined spot. FIG. 2 schematically shows the case by a diagrammatic perspective view. In FIG. 2, an electrical/electronic part 2 includes a metal base material 21 and an insulating film 22, and a gap 23 is created between the metal base material 21 and the insulating film 22 near a punched surface 21a of the metal base material 21. The tendency increases when a clearance in the punching process becomes larger (for example, 5% or more relative to a thickness of the metal base material). In other words, it can be said that since there are practical limitations in reducing the clearance during the punching process, this tendency is increased as the work-piece becomes finer (for example, having a thickness of the metal base material of 0.1 mm or less, or having a width of punching process of 0.1 mm or less).

In the state described above, the insulating film 22 may be totally peeled off from the metal base material 21 due to aging or the like, and it is meaningless to provide the insulating film 22 on the metal base material 21. Further, it is not practical to apply the insulating film after micromachining because it is extremely laborious, thus increasing costs of the product. When it is conceivable to use an exposed metal surface of the electrical/electronic part thus formed as the contact of the connector or the like, it is possible to form the metal layer on the exposed metal surface (for example, the punched surface 21a) through plating or the like in a later step. In this case, however, upon immersing in a plating solution, the plating liquid may enter through the gap 23, thereby promoting the insulating film 22 to peel off from the metal base material 21.

The problems described above may be solved by selecting a polyimide for the insulating film. However, since polyimides are not only highly expensive but also requires time-consuming treatments for forming films in many cases, which is not desirable in terms of economic efficiency. Furthermore, although polyimides have satisfactory punching workability, since elongation of the film is small, polyimides frequently have insufficient bending workability. Thus, when the work-piece requires fine bending work, the material is unsuitable.

In order to improve adhesion between the metal base material and the insulating film, if a method in Patent Literature 2 is adapted, since a solution life of the coupling agent is short, it is necessary to carefully control the solution. Further, it is difficult to homogeneously treat a whole surface of the metal base material, so that it is difficult to obtain a sufficient effect relative to the small gap described above. When a method in Patent Literature 3 is adapted, it is necessary to plate under a strict plating condition to control a crystal state of the plated layer, and to carefully control. Further, it is necessary to increase a thickness of the plated layer to be more than 1 μm in order to obtain enough adhesion, thereby making it not economical.

An object of the present invention is to provide a composite material for an electrical/electronic part capable of maintaining high adhesion between a metal base material and an insulating film even when a machining process such as a punching process is carried out on a part including an interface between the metal base material and the insulating film. A further object of the present invention is to provide an electrical/electronic part formed of the composite material.

Solution to Problem

As a result of ardent study, the inventors have found that it is possible to obtain sufficient adhesion between a metal base material and an insulating film when the insulating film is disposed on the metal base material through a metal layer formed of nickel (Ni) or a nickel-zinc (Ni—Zn) alloy, thereby reaching the present invention through further study.

According to the present invention, there is provided the following means:

(1) A composite material for an electrical/electronic part, which is used as a material for use in an electrical/electronic part formed by punching process, comprising:

a metal base material; and a substantially one layer of an insulating film provided on at least a part of the metal base material, wherein a metal layer formed of Ni or a Ni—Zn alloy is interposed between said metal base material and said insulating film, such that the peel width of said insulating film at the end of the material obtained after said punching process, is less than 10 µm.

(2) The composite material for an electrical/electronic part described in the above item (1), wherein the thickness of the metal layer formed of Ni or a Ni—Zn alloy is 0.001 µm or more and less than 0.1 µm.

(3) The composite material for an electrical/electronic part described in the above item (1) or (2), wherein the insulating film is composed of a polyamide-imide.

(4) The composite material for an electrical/electronic part described in any one of the above items (1) to (3), wherein said metal base material is formed of a copper-type metal material.

(5) The composite material for an electrical/electronic part described in any one of the above items (1) to (4), wherein said metal base material has a thickness of 0.06 to 0.4 mm.

(6) An electrical/electronic part, which is formed such that after the punching process of the composite material for an electrical/electronic part described in any one of the above items (1) to (5), said insulating film remains behind on at least a part of said metal base material.

(7) The electrical/electronic part described in the above item (6), which is formed by performing wet plating at a site where said insulating film is not provided after the punching process.

In the present invention, a specimen is punched out into a rectangular shape of 5 mm×2 mm using a die with a clearance of 5 µm, and the specific is immersed in an aqueous solution in which red ink is dissolved, so that the peel width of the insulating film at the end of the material after punching is measured.

Advantageous Effects of Invention

According to the present invention, there can be obtained a composite material for electrical/electronic part, which is such that since a metal layer formed of Ni or a Ni—Zn alloy is interposed between a metal base material and an insulating film, even if the composite material is subjected to processing such as punching process at a spot including the interface between the metal base material and the insulating film (specifically, the interface between the metal base material and the metal layer and the interface between the metal layer and the insulating film), the composite material maintains a state in which the adhesion between the metal base material and the insulating film is high and has excellent workability.

Further, in the present invention, it is possible to easily obtain the composite material for the electrical/electronic part capable of maintaining the high adhesive between the metal base material and the insulating film through the following configurations:

(1) The metal layer has a thickness of 0.001 µm or more and less than 0.1 µm.

(2) The insulating film is composed of a polyamide-imide.

(3) The metal base material is formed of a copper type metal material.

(4) The metal base material has a thickness of 0.06 to 0.4 mm.

The electrical/electronic part of the present invention is an electrical/electronic part formed as a composite material for electrical/electronic part having an insulating film provided on at least a part of a metal base material is processed by punching process or the like, such that the insulating film remains behind on a part of the metal base material. Further, since the composite material has a metal layer formed of Ni or a Ni—Zn alloy interposed between the metal base material and the insulating film, an electrical/electronic part which has the insulating film closely adhered to the metal base material via the metal layer, and has excellent workability in punching process or the like, can be easily obtained.

Furthermore, since the electrical/electronic part of the present invention has the metal base material and the insulating film closely adhered to each other, it is made possible to easily provide a post-applied metal layer by post-processing such as plating at a spot where the insulating film is not provided. Thus, even if this electrical/electronic part is used in an arrangement with a narrow pitch, the electrical/electronic part does not cause any insulating failure or the like, which is caused by the peeling of the insulating film from the metal base material.

Other and further features and advantages of the invention will appear more fully from the following description, appropriately referring to the accompanying drawings.

BRIEF DESCRIPTION OF THE DRAWINGS

FIG. 1 is a section view showing one exemplary composite material for an electrical/electronic part according to a preferred embodiment of the invention.

FIG. 2 is a schematic view showing one exemplary state in which gaps are created between a metal base material and an insulating film by a diagrammatic perspective view.

REFERENCE NUMERALS

1 Composite material for an electrical/electronic part
2 Electrical/electronic part
11, 21 Metal base material
12, 22 Insulating film
13 Metal layer
21a Punched surface
23 Gap

BEST MODE FOR CARRYING OUT THE INVENTION

Hereinafter, preferred embodiments of a composite material for electrical/electronic part of the present invention will be described.

It is note that the present invention is not intended to be limited to these embodiments. For example, the insulating film and the metal layer may be provided on one surface of the metal base material, or may be provided on both surfaces of the metal base material. The embodiments of the present invention can be appropriately modified in accordance with the required characteristics of the electrical/electronic part obtained as a final product.

FIG. 1 shows an example of a cross-section of a composite material for an electrical/electronic part according to a preferred embodiment of the present invention. As shown in FIG. 1, the composite material for the electrical/electronic part 1 is provided with an insulating film 12 on a metal base material 11 and with metal layers 13 formed of Ni or a Ni—Zn alloy between the metal base material 11 and the insulating film 12.

This metal layer 13 increases the adhesion between the metal base material 11 and the insulating film 12, and thereby can realize the composite material for an electrical/electronic part 1 having excellent workability in punching process or the like.

FIG. 1 shows the case in which the insulating film 12 is provided on a part of an upper surface of the metal base material 11 and on a whole lower surface of the metal base material 11. However, this case is one exemplary case to the end. The insulating film 12 may be provided on the whole upper and lower surfaces of the metal base material 11 or may be provided on a part of the upper and lower surfaces of the metal base material 11. That is, the insulating film 12 is provided at least a part of the metal base material 11.

The metal layer 13 is provided to enhance the adhesion between the metal base material 11 and the insulating film 12. The adhesion of the metal base material 11 and the insulating film 12 is preferable to be such that a peel width of the insulating film at the end of the material after punching is less than 10 μm, more preferably to be less than 5 μm.

The metal layer 13 is preferably formed by means of electroplating, chemical plating or the like, and the metal layer 13 is made of Ni or a Ni—Zn alloy. The Ni—Zn alloy contains Zn preferably at a proportion of 50% by mass or less, and more preferably 10% to 30% by mass, relative to the total amount of the alloy.

In the case of forming the metal layer 13 by plating, the plating may be wet or dry plating. The wet plating includes electrolytic plating and electroless plating methods for example. The dry plating includes physical vapor deposition (PVD) and chemical vapor deposition (CVD) methods, for example.

The adhesion of the metal layer 13 with the metal base material 11 and the insulating film 12 is not enhanced if the thickness of the metal layer 13 is too thin. On the other hand, not only the adhesion is decreased but also the production cost increases if the thickness of the metal layer 13 is too thick. From these points, a thickness of the metal layer 13 is preferably 0.001 μm or more and less than 0.1 μm, more preferably from 0.005 to 0.05 μm. The reason why the adhesion is decreased when the metal layer is excessively thick, is not clearly known; however, the reason is thought to be that when the metal layer is thin, the metal layer does not acquire a perfectly layered form, and metal may be scattered in the form of islands or may form a metal layer with many pinholes, so that a large contact area between the metal layer and the insulating film can be taken. On the other hand, if the metal layer is excessively thick, the metal layer acquires a smooth layered form, and the contact area between the metal layer and the insulating film is narrowed. Furthermore, if the metal layer is excessively thick, when the composite material is subjected to fabrication such as punching processing or bending processing, shear droop is enlarged, or cracks occur, so that there is a risk that peeling of the insulating film may be promoted. Therefore, even from this point of view, it is preferable to adjust the thickness of the metal layer 13 to less than 0.1 μm.

While it is preferable to use an organic material such as synthetic resins as the material of the insulating film 12, the material of the insulating film 12 may be appropriately selected corresponding to required characteristics and others of the composite material for an electrical/electronic part 1. For instance, the base material of the organic material such as the synthetic resin added with an additive (either organic or nonorganic material may be used) other than the base material and non-organic materials may be adopted.

As described above, it is desirable that the insulating film 12 has appropriate insulating properties, and it is desirable that the insulating film has heat resistance, when the possibility of reflow mounting of the electrical/electronic part is considered. Among them, in particular, a polyamide-imide which is a heat resistant resin, is desirable, when the balance between the raw material cost, productivity, and workability such as punching workability or bending workability is considered.

It is desirable that a copper-based metal material is used as the metal base material 11 in terms of the electric conductivity, plating property and the like. Beside copper-based alloys such as phosphor bronze (Cu—Sn—P-series), brass (Cu—Zn-series), nickel silver (Cu—Ni—Zn-series) and Corson alloy (Cu—Ni—Si-series), oxygen-free copper, tough pitch copper, phosphorous-deoxidized copper and others are also applicable as the copper material.

A thickness of the metal base material 11 is preferable to be 0.06 mm or more because enough strength as the electrical/electronic part cannot be assured if the thickness is thinner than 0.06 mm. Still more, the thickness is preferably 0.4 mm or less, more preferably 0.3 mm or less, because an absolute value of a clearance increases in punching and a shear droop of the punched part increases if the thickness is too large. Thus, an upper limit of the thickness of the metal base material 11 is decided by taking the influences (such as the clearance and the size of the shear droop) of machining such as punching into consideration.

A method of providing the insulating film 12 on the surface of the metal base material 11 through the intermediary of the metal layer 13 includes such methods of (a) placing an adhesive-backed heat-resistant resin film at a part of the metal base material requiring insulation, of melting the adhesive by an induction heating roll and of then implementing a heat treatment to reactively harden and bond them; and (b) applying a varnish prepared by dissolving a resin or a resin precursor in a solvent at a part of the metal base material requiring insulation, and then heating the assembly, with or without having the solvent evaporated as necessary, to thereby induce reactive curing and bonding. It is preferable to use the method (b) described above for the composite material for an electrical/electronic part 1 of the embodiment of the present invention because it is not necessary to consider the influences of the adhesive.

It is noted that a concrete example of the method (b) described above is a general technology in a method for manufacturing insulated electric cables and is known also in JP-A-5-130759. The present invention refers to this gazette as a reference technology.

Here, it is possible to repeat the method (b). It permits to reduce a possibility of insufficient evaporation of the solvent, and to reduce a possibility of generating bubbles between the insulating film 12 and the metal layer 13, so that the adhesion between the insulating film 12 and the metal layer 13 may be enhanced further. This method permits to provide substantially one layer of insulating film 12 on the metal layer 13 in the case where the hardened resins formed separately in a plurality of times are substantially the same material. The phrase "provide substantially one layer of insulating film" according to the present invention means the situation in which one layer of an insulating film is provided by a single step of (a) or (b) described above, as well as the situation in which substantially identical insulating coatings are provided in a multilayered manner through several steps as described above.

Still more, when the insulating film 12 is to be provided on a part of the surface of the metal base material 11, it is possible to adopt a manufacturing method that corresponds to a resin film forming accuracy level of the applied part such as a method of applying a roll coating facility for an offset (planographic) printing or a gravure (intaglio) printing; of applying coating of a photosensitive heat-resistant resin, pattern-forming by means of ultraviolet rays or electron beams and a resin hardening technology; or of applying a micro-pattern forming technology applying etching and dissolution by an exposure phenomenon on a circuit board. This method is carried our after the metal layer 13 is provided on the surface of the metal base material 11. Those methods make it easily possible to provide the insulating film 12 only on a necessary part(s) of the surface of the metal base material 11 and it becomes unnecessary to remove the insulating film 12 to connect the metal base material 11 with other electric and electronic parts or electric cables.

A thickness of the insulating film 12 is preferable to be from 2 to 20 μm and more preferably from 3 to 10 μm because it is unable to expect an insulating effect if the thickness is too thin and it becomes difficult to punch if the thickness is too thick.

After the composite material for an electrical/electronic part 1 is processed by punching process or the like, since the metal base material is exposed at a site where the insulating film 12 is partially not present, there are advantages that soldering can be carried out and heat releasability is maintained high. Thus, the composite material is adequate for parts requiring heat release.

The site where the insulating film 12 is not provided may be subjected to wet plating. The term "site where the insulating film 12 is not provided" means, for example, the lateral sides of the metal base material 11 shown in FIG. 1, or a site other than the part of the upper surface of the metal base material 11 that is provided with the insulating film 12. Examples of the plating treatment used herein include Ni plating, Sn plating and Au plating. By providing a post-applied metal layer by plating, the surface of the metal base material 11 can be protected.

When a conventional metal material provided with an insulating film is subjected to processing such as punching process and then to a wet plating treatment, there is a risk that the plating liquid may infiltrate into the voids that have been generated during processing and promote the peeling of the insulating film from the metal base material. However, the composite material for an electrical/electronic part 1 of the present embodiment has an advantage that since a metal layer 13 formed of Ni or a Ni—Zn alloy is interposed between the metal base material 11 and the insulating film 12, even if a post-applied metal layer (not depicted) is provided by a post-processing such as plating, the insulating film 12 does not peel off from the metal base material 11.

Here, the thickness of the post-applied metal layer is appropriately determined regardless of the thickness of the metal layer 13. When the purpose of protecting the surface of the metal base material 11 is considered, the thickness of the post-applied metal layer is desirably in the range of 0.001 μm to 5 μm. Still more, while a metal used for the post-applied metal layer may be appropriately selected depending on uses of the electrical/electronic part, it is preferable to be Au, Ag, Cu, Ni, Pd or Sn, or an alloy containing them when the electrical/electronic part is used as an electrical contact, a connector or the like.

The composite material for electrical/electronic part 1 of the present invention can be used, after being punched, in any electrical/electronic part. Such parts are not limited specifically and include, for example, a connector, a terminal and a shield case, which are adopted in electric/electronic devices such as a portable phone, a portable information terminal, a notebook computer, a digital camera, and a digital video.

When the composite material for electrical/electronic part of the present invention is fabricated into a case part such as a shield case, since the property of being insulated from other parts can be maintained satisfactory, the composite material is favorable to a low height device container case. When the composite material is fabricated into a part for electrical connection such as a connector or a terminal, the property of being insulated from the adjacent parts can be maintained satisfactory, and thus the composite material is advantageous in the pitch reduction of a connector, or the like.

EXAMPLES

The present invention will be described in more detail based on examples given below, but the invention is not meant to be limited by these.

Example 1

Samples

Metal strips (metal base material) having a thickness of 0.1 mm and a width of 20 mm were subjected to electrolytic degreasing and acid pickling treatments in this order, and then were subjected to Ni plating, Ni-10% (mass %; hereinafter, the same) Zn alloy plating or Ni-30% Zn alloy plating to a thickness of about 0.001 μm, 0.005 μm, 0.02 μm, 0.05 μm, 0.085 μm, 0.1 μm and 0.2 μm, respectively, to thereby construct a metal layer. Subsequently, an insulating resin film of a polyamide-imide having a width of 10 mm was provided at a position 5 mm away from the end of each strip. Thus, composite materials for electrical/electronic part of this invention and comparative examples were produced.

The metal strip used was JIS alloy C5210R (phosphor bronze manufactured by Furukawa Electric Co., Ltd.). It is noted that the measurement of the plating thickness was carried out in terms of an average value of ten samples by using an X-ray fluorescence thickness meter SFT-3200 (made by Seiko-Epson Precision Co.).

Still more, beside those described above and as comparative examples, the electrolytic degreasing and acid pickling treatments were carried out in this order and composite materials for an electrical/electronic part were formed by providing the insulating resin film at part requiring insulation without implementing plating (without metal layer).
(Various Conditions)

The electrolytic degreasing treatment was carried out by implementing cathode-electrolysis on the metal strip for 10 to 30 seconds under conditions of 60° C. of liquid temperature and 2.5 A/dm$^2$ of current density within a degreasing solution containing 60 g/L of cleaner 160S (manufactured by Meltex Inc.).

The acid pickling treatment was carried out on the metal strip by soaking it into an acid pickling solution containing 100 g/L of sulfuric acid for 10 to 30 seconds in room temperature.

The time for the electrolytic degreasing and acid pickling treatment were appropriately determined in the range described above, as a result of adjusting the lining speed to obtain a predetermined plating thickness during the post-plating treatment.

The Ni plating was carried out under conditions of 55° C. of liquid temperature and 1 to 10 A/dm$^2$ of current density within a plating solution containing 400 g/L of nickel sulfamite, 30 g/L of nickel chloride and 30 g/L of boric acid while adjusting current density, a length of a plating tank and lining speed so that the plating grows to a predetermined thickness.

The Ni-10% Zn alloy plating was carried out under conditions of 40° C. of liquid temperature and 0.5 to 5 A/dm² of current density within a plating solution containing 5 g/L of nickel sulfate, 1 g/L of zinc pyrrolate and 100 g/L of potassium pyrrolate while adjusting the current density, the length of the plating tank and lining speed so that the plating grows to a predetermined thickness.

The Ni-30% Zn alloy plating was carried out under conditions of 25° C. of liquid temperature and 0.05 to 0.5 A/dm² of current density within a plating solution containing 75 g/L of nickel chloride, 30 g/L of zinc chloride, 30 g/L of ammonium chloride and 15 g/L of sodium thiocyanate while adjusting the current density, the length of the plating tank and lining speed so that the plating grows to a predetermined thickness.

The insulating film layer was formed by perpendicularly discharging varnish (fluid applied substance) on the surface of the running metal base material out of a rectangular discharging port of an applicator and by heating it for 30 seconds at 300° C. The varnish was produced so that a thickness of the resin grows to a range from 8 to 10 μm by using a polyimide (PAI) solution using n-methyl 2-pyrolidone as solvent (made by Totoku Toryo Co. Ltd.,).

(Evaluation)

The evaluation of the punching workability of the composite materials for an electrical/electronic part thus obtained was made as follows.

The punching workability was evaluated by punching through the samples into a rectangular shape of 5 mm×2 mm by using a die of 5 μm of clearance and by soaking the samples into an aqueous solution in which red ink was dissolved. Cases when the peel width of the film at the punched end of the material was less than 5 μm were denoted by "Excellent (◉)", cases when the peel width was more than 5 μm and less than 10 μm are denoted by "Good (○)" and cases when the width was more than 10 μm are denoted by "Poor (x)".

Furthermore, for each of the materials, the adhesive strength of the insulating film was measured using SAICAS DN-20S manufactured by Daipla Wintes Co., Ltd. The measurement was carried out using a diamond cutting blade having a width of 1 mm, a rake angle of 20° and a relief angle of 10°, under the conditions of a constant speed mode, a horizontal speed of 2.0 μm/s and a vertical speed of 0.1 μm/s, respectively. Table 1 shows those results.

TABLE 1

Base material: phosphorus bronze

| | Sample No. | Type of plating | Thickness of plating [μm] | Evaluation of punching workability | Adhesive strength [kN/m] |
|---|---|---|---|---|---|
| This invention | 1 | Ni | 0.001 | ○ | 0.85 |
| | 2 | | 0.006 | ◉ | 0.88 |
| | 3 | | 0.021 | ◉ | 0.90 |
| | 4 | | 0.046 | ◉ | 0.87 |
| | 5 | | 0.085 | ○ | 0.83 |
| | 6 | Ni—10% Zn | 0.001 | ○ | 0.84 |
| | 7 | | 0.005 | ◉ | 0.88 |
| | 8 | | 0.020 | ◉ | 0.91 |
| | 9 | | 0.047 | ◉ | 0.86 |
| | 10 | | 0.086 | ○ | 0.84 |
| | 11 | Ni—30% Zn | 0.002 | ○ | 0.84 |
| | 12 | | 0.005 | ◉ | 0.87 |
| | 13 | | 0.022 | ◉ | 0.90 |
| | 14 | | 0.050 | ◉ | 0.86 |
| | 15 | | 0.083 | ○ | 0.83 |

TABLE 1-continued

Base material: phosphorus bronze

| | Sample No. | Type of plating | Thickness of plating [μm] | Evaluation of punching workability | Adhesive strength [kN/m] |
|---|---|---|---|---|---|
| Comparative example | 16 | Non-plated | | x | 0.76 |
| | 17 | Ni | 0.106 | x | 0.78 |
| | 18 | | 0.203 | x | 0.77 |
| | 19 | Ni—10% Zn | 0.105 | x | 0.79 |
| | 20 | | 0.200 | x | 0.77 |
| | 21 | Ni—30% Zn | 0.108 | x | 0.79 |
| | 22 | | 0.197 | x | 0.76 |

As shown in Table 1, in sample No. 16 of the comparative example in which no metal layer was interposed (no base plating applied), and samples Nos. 17 to 22 of the comparative example in which the plating thickness was thick, the adhesive strength of the insulating film was low, and also, the peel width was 10 μm or more, so that punchability was poor.

On the contrary, samples Nos. 1 to 15 of the present invention had an adhesive strength of the insulating film of 0.8 kN/m or more and had excellent punchability, so that the samples are adequate for the use in precision press working. Particularly, samples Nos. 2 to 4, Nos. 7 to 9 and Nos. 12 to 14, in which the thickness of the metal layer was 0.005 to 0.05 μm, had an adhesive strength of 0.86 kN/m or more, and had particularly excellent punchability.

Example 2

Composite materials were produced in the same manner as in Example 1 except that JIS alloy C7701 (nickel silver, made by Mitsubishi Metex Co., Ltd.) was used as the metal strip. Table 2 shows its results.

TABLE 2

Base material: nickel silver

| | Sample No. | Type of plating | Thickness of plating [μm] | Evaluation of punching workability | Adhesive strength [kN/m] |
|---|---|---|---|---|---|
| This invention | 23 | Ni | 0.002 | ○ | 0.85 |
| | 24 | | 0.005 | ◉ | 0.87 |
| | 25 | | 0.019 | ◉ | 0.90 |
| | 26 | | 0.048 | ◉ | 0.87 |
| | 27 | | 0.084 | ○ | 0.84 |
| | 28 | Ni—10% Zn | 0.002 | ○ | 0.84 |
| | 29 | | 0.006 | ◉ | 0.87 |
| | 30 | | 0.021 | ◉ | 0.90 |
| | 31 | | 0.050 | ◉ | 0.86 |
| | 32 | | 0.085 | ○ | 0.84 |
| | 33 | Ni—30% Zn | 0.001 | ○ | 0.83 |
| | 34 | | 0.005 | ◉ | 0.86 |
| | 35 | | 0.020 | ◉ | 0.91 |
| | 36 | | 0.049 | ◉ | 0.87 |
| | 37 | | 0.086 | ○ | 0.84 |
| Comparative example | 38 | Non-plated | | x | 0.76 |
| | 39 | Ni | 0.103 | x | 0.79 |
| | 40 | | 0.198 | x | 0.77 |
| | 41 | Ni—10% Zn | 0.104 | x | 0.78 |
| | 42 | | 0.197 | x | 0.77 |
| | 43 | Ni—30% Zn | 0.110 | x | 0.79 |
| | 44 | | 0.201 | x | 0.76 |

As shown in Table 2, in sample No. 38 of the comparative example in which no metal layer was interposed (no base plating applied), and samples Nos. 39 to 44 of the comparative example in which the plating thickness was thick, the adhesive strength of the insulating film was low, and also, the peel width was 10 μm or more, so that punchability was poor. On the contrary, samples Nos. 23 to 37 of the present invention had an adhesive strength of the insulating film of 0.8 kN/m or more and had excellent punchability, so that the samples are adequate for the use in precision press working. Particularly, samples Nos. 24 to 26, Nos. 29 to 31 and Nos. 34 to 36, in which the thickness of the metal layer was 0.005 to 0.05 had an adhesive strength of 0.86 kN/m or more, and had particularly excellent punchability.

Example 3

Composite materials were produced in the same manner as in Example 1 except that JIS alloy C7025R (Corson copper, made by Nippon Mining & Metals Corporation) was used as the metal strip. Table 3 shows its results.

TABLE 3

Base material: Corson copper

|  | Sample No. | Type of plating | Thickness of plating [μm] | Evaluation of punching workability | Adhesive strength [kN/m] |
|---|---|---|---|---|---|
| This invention | 45 | Ni | 0.001 | ○ | 0.86 |
|  | 46 |  | 0.006 | ◉ | 0.88 |
|  | 47 |  | 0.022 | ◉ | 0.91 |
|  | 48 |  | 0.050 | ◉ | 0.88 |
|  | 49 |  | 0.086 | ○ | 0.83 |
|  | 50 | Ni—10% Zn | 0.002 | ○ | 0.84 |
|  | 51 |  | 0.004 | ◉ | 0.88 |
|  | 52 |  | 0.021 | ◉ | 0.90 |
|  | 53 |  | 0.050 | ◉ | 0.87 |
|  | 54 |  | 0.085 | ○ | 0.83 |
|  | 55 | Ni—30% Zn | 0.001 | ○ | 0.84 |
|  | 56 |  | 0.005 | ◉ | 0.87 |
|  | 57 |  | 0.023 | ◉ | 0.90 |
|  | 58 |  | 0.049 | ◉ | 0.86 |
|  | 59 |  | 0.084 | ○ | 0.84 |
| Comparative example | 60 | Non-plated |  | x | 0.77 |
|  | 61 | Ni | 0.105 | x | 0.79 |
|  | 62 |  | 0.201 | x | 0.77 |
|  | 63 | Ni—10% Zn | 0.105 | x | 0.78 |
|  | 64 |  | 0.198 | x | 0.76 |
|  | 65 | Ni—30% Zn | 0.106 | x | 0.78 |
|  | 66 |  | 0.199 | x | 0.76 |

As shown in Table 3, in sample No. 60 of the comparative example in which no base plating was applied, and samples Nos. 61 to 66 of the comparative example in which the plating thickness was thick, the adhesive strength of the insulating film was low, and also, the peel width was 10 μm or more, so that punchability was poor.

On the contrary, samples Nos. 45 to 59 of the present invention had an adhesive strength of the resin of 0.8 kN/m or more and a peel width of less than 10 μm, that is, had excellent punchability, so that the samples are adequate for the use in precision press working. Particularly, samples Nos. 46 to 48, Nos. 51 to 53 and Nos. 56 to 58, in which the thickness of the metal layer was 0.005 to 0.05 μm, had an adhesive strength of 0.86 kN/m or more, and had particularly excellent punchability.

Example 4

The respective materials of Examples 1 to 3 were punched into a rectangular shape of 5 mm×2 mm using a die having a clearance of 5 μm, and were subjected to electrolytic degreasing and acid pickling treatments in this order and to Ni plating. The degree of progress of the peel width of the film in the post-plating treatment was evaluated.

The electrolytic degreasing and acid pickling treatments and Ni plating were carried out by beaker plating under the same conditions as the those in Example 1. The time for the electrolytic degreasing and acid pickling treatments were respectively 30 seconds. The Ni plating was carried out at a current density of 5 A/dm2 for a time period of 1 minute. In this case, the thickness of the Ni plating was approximately 1 μm.

The evaluation of the degree of progress of the peel width of the film was carried out by immersing the material obtained after plating, in an aqueous solution containing a red ink dissolved therein, and measuring how far the peel width of the film at the end of the material has progressed, with respect to the peel width of the film evaluated in Examples 1 to 3. The evaluation criteria were such that it was rated "excellent (z,900 )" when the progress of the peel width was less than 5 μm; "good (○)" when the progress was 5 μm or more and less than 10 μm; "fail (x)" when the progress was 10 μm or more; and "peeled (xx)" when the film was completely peeled off from the material.

Table 4 shows its results.

TABLE 4

|  | Sample No. | Evaluation of progress of peel | Sample No. | Evaluation of progress of peel | Sample No. | Evaluation of progress of peel |
|---|---|---|---|---|---|---|
| This invention | 1 | ○ | 23 | ○ | 45 | ○ |
|  | 2 | ○ | 24 | ○ | 46 | ○ |
|  | 3 | ◉ | 25 | ◉ | 47 | ◉ |
|  | 4 | ◉ | 26 | ◉ | 48 | ◉ |
|  | 5 | ○ | 27 | ○ | 49 | ○ |
|  | 6 | ○ | 28 | ○ | 50 | ○ |
|  | 7 | ○ | 29 | ○ | 51 | ○ |
|  | 8 | ◉ | 30 | ◉ | 52 | ◉ |
|  | 9 | ◉ | 31 | ◉ | 53 | ◉ |
|  | 10 | ○ | 32 | ○ | 54 | ○ |
|  | 11 | ○ | 33 | ○ | 55 | ○ |
|  | 12 | ○ | 34 | ○ | 56 | ○ |
|  | 13 | ◉ | 35 | ◉ | 57 | ◉ |
|  | 14 | ◉ | 36 | ◉ | 58 | ◉ |
|  | 15 | ○ | 37 | ○ | 59 | ○ |
| Comparative example | 16 | xx | 38 | xx | 60 | xx |
|  | 17 | x | 39 | x | 61 | x |
|  | 18 | x | 40 | x | 62 | x |
|  | 19 | x | 41 | x | 63 | x |
|  | 20 | x | 42 | x | 64 | x |

TABLE 4-continued

| Sample No. | Evaluation of progress of peel | Sample No. | Evaluation of progress of peel | Sample No. | Evaluation of progress of peel |
|---|---|---|---|---|---|
| 21 | x | 43 | x | 65 | x |
| 22 | x | 44 | x | 66 | x |

As shown in Table 4, in the samples of the comparative examples where no metal layer was interposed (no base plating applied) and the samples of the comparative examples in which the plating thickness was thick, the peel width of the film progressed, and it was found that the materials were not suitable for the application in which the material is subjected to a plating treatment after being punched. Particularly, in samples Nos. 16, 38 and 60, in which no metal layer was interposed (no base plating applied), the film was completely peeled off from the material. On the other hand, in the samples of the present invention, the progress of the peel width of the film was less than 10 μm, and it was found that the materials can be applied even to the application in which the material is subjected to a plating treatment after being punched. Particularly, in the samples having a thickness of the metal layer of 0.01 to 0.05 μm, the progress of the peel width of the film was less than 5 μm, and it was found that the materials were particularly adequate for the application in which the material is subjected to a plating treatment after being punched.

Having described our invention as related to the present embodiments, it is our intention that the invention not be limited by any of the details of the description, unless otherwise specified, but rather be construed broadly within its spirit and scope as set out in the accompanying claims.

This non-provisional application claims priority under 35 U.S.C. §119 (a) on Patent Application No. 2008-164851 filed in Japan on Jun. 24, 2008, and Patent Application No. 2008-300181 filed in Japan on Nov. 25, 2008, each of which is entirely herein incorporated by reference.

The invention claimed is:

1. A composite material for an electrical/electronic part, which is used as a material for use in the electrical/electronic part formed by punching process, comprising:
   a metal base material; and
   a substantially one layer of a polyamide-imide insulating film is provided on at least a part of the metal base material,
   wherein a metal layer formed of Ni or a Ni—Zn alloy and having a thickness between 0.001 μm to 0.1 μm, is interposed between said metal base material and said insulating film, such that a peel width of said insulating film at an end of the metal base material obtained after said punching process, is less than 10 μm.

2. The composite material for an electrical/electronic part according to claim 1, wherein said metal base material is formed of a copper base metal material.

3. The composite material for an electrical/electronic part according to claim 1, wherein said metal base material has a thickness of 0.06 to 0.4 mm.

4. An electrical/electronic part, which is formed such that after the punching process of the composite material for an electrical/electronic part according to claim 1, said insulating film remains behind on at least a part of said metal base material.

5. The electrical/electronic part according to claim 4, wherein after the punching process, a wet plating is performed at a site where the insulating film is not provided, in order to form the electrical/electronic part.

6. A composite material for an electrical/electronic part, which is used as a material for use in the electrical/electronic part formed by punching process, comprising:
   a copper base material; and
   a substantially one layer of an insulating film provided on at least a part of the copper base material, the insulating film being composed of a polyamide-imide,
   wherein a metal layer formed of Ni or a Ni—Zn alloy and having thickness of 0.001 um or more and less than 0.1 μm is interposed between said copper base material and said insulating film, such that a peel width of said insulating film at an end of the copper base material obtained after said punching process, is less than 10 μm, and
   wherein said punching process is performed by punching through the composite material into a rectangular shape of 5 mm×2 mm by using a die of 5 μm of clearance and by soaking the punched composite material into an aqueous solution in which a red ink is dissolved.

* * * * *